United States Patent
Schmaunz et al.

(10) Patent No.: US 10,115,558 B2
(45) Date of Patent: Oct. 30, 2018

(54) METHODS AND DEVICES FOR CHARGE COMPENSATION

(71) Applicant: Carl Zeiss Microscopy GmbH, Jena (DE)

(72) Inventors: Andreas Schmaunz, Oberkochen (DE); Markus Esseling, Aalen (DE); Dirk Zeidler, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 148 days.

(21) Appl. No.: 15/059,712

(22) Filed: Mar. 3, 2016

(65) Prior Publication Data

US 2016/0260574 A1    Sep. 8, 2016

(30) Foreign Application Priority Data

Mar. 6, 2015 (DE) .................. 10 2015 204 091

(51) Int. Cl.
*H01J 37/28* (2006.01)
*H01J 37/02* (2006.01)
*H01J 37/22* (2006.01)

(52) U.S. Cl.
CPC .......... *H01J 37/026* (2013.01); *H01J 37/222* (2013.01); *H01J 37/28* (2013.01); *H01J 2237/006* (2013.01); *H01J 2237/0044* (2013.01); *H01J 2237/0047* (2013.01); *H01J 2237/2801* (2013.01)

(58) Field of Classification Search
CPC ........ H01J 37/026; H01J 37/222; H01J 37/28; H01J 2237/006; H01J 2237/0047; H01J 2237/0044; H01J 2237/2801

USPC ................. 250/306, 307, 310, 311
See application file for complete search history.

(56) References Cited

U.S. PATENT DOCUMENTS

| 6,661,005 | B1 * | 12/2003 | Bruenger | ............ | H01J 37/026 |
| | | | | | 250/306 |
| 8,969,835 | B2 * | 3/2015 | Zeile | ............... | H01J 37/02 |
| | | | | | 250/492.1 |
| 9,536,704 | B2 * | 1/2017 | Langer | | |
| 2008/0142735 | A1 | 6/2008 | Chandler et al. | | |

(Continued)

FOREIGN PATENT DOCUMENTS

| DE | 3332248 A1 | 3/1985 |
| DE | 19851622 A1 | 5/2000 |

(Continued)

OTHER PUBLICATIONS

German Office Action, with translation thereof, for corresponding DE App No. 10 2015 204 091.7, dated Feb. 10, 2016.

(Continued)

*Primary Examiner* — Michael Maskell
(74) *Attorney, Agent, or Firm* — Fish & Richardson P.C.

(57) ABSTRACT

Methods are provided for operating a particle-optical device, wherein electrical charging of a sample to be examined is reduced. The particle-optical device includes a vacuum chamber for receiving a sample, a particle source for generating a primary particle beam directed to the sample, a scan generator for directed guidance of the primary particle beam over the sample surface, and at least one detector for detecting interaction products created during the interaction between the primary particle beam and the sample.

26 Claims, 9 Drawing Sheets

(56) References Cited

U.S. PATENT DOCUMENTS

2013/0187046 A1    7/2013   Zeidler et al.
2014/0092230 A1*   4/2014   Langer ............... G01N 23/2251
                                                                         348/80

FOREIGN PATENT DOCUMENTS

DE      10 2012 001 267 A1    7/2013
EP              1455379        9/2004
WO    WO 2012/041464 A1    4/2012

OTHER PUBLICATIONS

B. Titze, "Techniques to prevent sample surfacec barging and reduce beam damage effects for SBEM imaging," Dissertation, University Heidelberg, 2013.

* cited by examiner

METHODS AND DEVICES FOR CHARGE COMPENSATION

CROSS-REFERENCE TO RELATED APPLICATION

The present application claims benefit under 35 USC 119 of German Application No. 10 2015 204 091.7, filed Mar. 6, 2015. The contents of this application is hereby incorporated by reference in its entirety.

FIELD

The present disclosure relates to methods and devices for compensating unwanted charging, which may occur during the particle-optical imaging of electrically non-conducting or poorly conducting samples.

BACKGROUND

During the imaging of a sample in a particle-optical device, such as e.g. a scanning electron microscope (SEM), the sample is irradiated by a beam of charged particles—by electrons in this case. Interaction products such as e.g. secondary electrons are released as a result of the interaction between the particles of the primary particle beam and the sample, the interaction products being detected and used for generating an image of the sample.

Samples which are imaged in this way should usually be electrically conductive. This allows the electric charge applied to the sample by the irradiation with electrons to dissipate. The same also applies if the sample is imaged not by an electron microscope but with the aid of an ion microscope and the sample is accordingly irradiated by ions. In both cases, charge applied to the sample surface is prevented from dissipating if non-conductive sample materials are used, and so there is a collection of electric charge on the sample.

Such electrostatic charging generally has an interfering effect on the image recording since it leads to a local signal change which falsifies the information content of the recorded image. Moreover, there can be unwanted migration of the image or distortions of the image. The release of secondary electrons from the sample can also be reduced, leading to a reduction in the image contrast.

Charging artifacts may also occur if dirt particles are present on a sample which is electrically conductive per se, the dirt particles behaving like local insulators such that the dirt particles charge and cause signal amplifications which interfere with the image impression.

During the observation in the SEM, the charging of the sample can be positive or negative. The sign of the charging depends, inter alia, on the landing energy, with which the primary electrons are incident on the sample, and on the local composition of the sample.

If the primary electrons are incident with an energy that is lower than a first critical energy depending on the composition and nature of the sample, the number of primary electrons exceeds the number of secondary electrons released from the sample material, and so there is negative charging. Negative charging may also occur if the primary electrons have a landing energy that is higher than a second critical energy which in turn is determined by the composition and nature of the sample. If the second critical energy is exceeded, primary electrons penetrate deep into the sample, and so only a few secondary electrons are released from the sample surface.

By contrast, if the kinetic energy of the primary electrons is selected in such a way that more secondary electrons are released than are replaced by incident primary electrons, the sample experiences positive charging.

When imaging with the aid of a focused ion beam (FIB), which usually consists of positive ions such as $Ga^+$ or $He^+$ ions, there may be an excess of positive charges as a result of the incidence of the primary particle beam.

In order to obtain particle-optical images with an improved quality and improved information content, it is desirable, as a matter of principle, to prevent, compensate or at least reduce electric charging of the sample.

Various methods and devices have been described, by which it is possible to counteract the aforementioned, unwanted charging artifacts.

It is possible to make the sample electrically conductive, or improve the conductivity thereof, by applying a coating made of conductive materials such as metals or carbon onto the sample surface. A disadvantage of this is that the sample is prepared with much outlay prior to the observation in the particle-optical device. Moreover, coating the sample may be generally undesirable.

Furthermore, a method in which the sample is observed during low vacuum operation is known. A disadvantage of this is that a special low-vacuum microscope with a specifically designed vacuum system and a specific detection system is involved.

In the case of electron microscopes which use electrostatic immersion lenses, i.e. objective lenses in which the sample lies within the objective lens and a potential difference dominates between the sample and the pole shoes of the objective lens, there moreover can be arcing between the pole shoe of the objective lens and the sample in the case of a vacuum that is too low.

For work with ion microscopes in particular, it has been proposed, in order to avoid positive charging, to additionally irradiate the sample with electrons in addition to the ion irradiation in order to neutralize the positive charges by negative charges. To this end, the employed ion microscope has an additional electron-optical column (flood gun). However, this method is unsuitable for electrostatic immersion lenses since the extraction fields present in this case accelerate the charged particles, and so, inter alia, charging effects would even be amplified.

A further method is based on the ionization of gases. In this case, gas is introduced in the vicinity of the sample such that the incident primary particle beam or the emitted secondary electrons interact with gas molecules. As result, charged gas particles and additional electrons can be created, which reduce or completely compensate the charging on the sample surface. A disadvantage in this case is that the overlap of the electron beam with the gas molecules, i.e. the simultaneous presence of electron beam and gas molecules, needs to be as short as possible. Otherwise, the secondary electrons interact with the charged gas particles and therefore they can no longer be used to generate an image, leading to deterioration in the image quality. Therefore, this means that gas needs to be introduced in the direct vicinity of the sample surface, and so the components used to this end are generally arranged between objective lens and sample, which may have a negative effect on the operation of the particle-optical device. Moreover, an excess of gas in the vacuum system of the device may have a disadvantageous effect on vacuum pumps and a particle source.

The following documents should be considered:
DE19851622A1
EP1455379

DE 3332248A1
DE10 2012 001 267 A1

SUMMARY

The disclosure provides methods by which unwanted electrical charging of a sample in a particle-optical device can be reduced or neutralized.

Moreover, the disclosure to provides devices, by which the methods according to the disclosure can be carried out.

The disclosure is based on the discovery that the ionization of gas molecules is a suitable method for reducing or neutralizing unwanted charging of a sample. Therefore, various, alternative methods for charge compensation via gas ionization are proposed. Charged gas particles are created by ionizing gas molecules present in the vicinity of the sample surface, which charged gas particles are suitable to weaken or completely neutralize the charge collected on the sample surface. In this manner, charging artifacts are prevented and images of the sample with an improved quality are obtained.

In a first refinement of the method, a suitable gas is introduced in a targeted manner in the vicinity of the sample to be examined. The ionization can be carried out by the action of a primary particle beam, i.e. a beam of charged particles. The charged particles can be electrons or ions. It is also conceivable for the ionization to be based on the action of secondary electrons, i.e. of products of the interaction between the primary particle beam and sample material. The generated gas ions and electrons are able to neutralize the charges on the sample. It is also conceivable for gas ions to be generated by other mechanisms, for example by impact ionization or photoionization.

The primary particle beam is guided in a grid-shaped manner over the sample surface, wherein interaction products are detected via a detector and an image of the sample is generated, from which image a partial image with a good image quality is selected.

In an alternative refinement of the method, gas in the form of a molecular beam is guided over the sample surface. In this case, gas under high pressure, which may be several bar, is expanded into an evacuated chamber through an aperture. The laminar part of the gas flow is cut out of the forming Mach cone with the aid of a skimmer, which projects into this expansion cone in front of the shock front. The linearly propagating gas jet generated thus is preferably guided past the sample such that ions are generated by interaction processes, which ions are suitable for compensating the charging of the sample. The ionization can be carried out by the action of the primary particle beam, which simultaneously serves to generate interaction products, which are detected and used for image generation.

In a further alternative embodiment of the method, use is made of the fact that an absolute vacuum never prevails in the sample chamber of the particle-optical device but that there always is a certain portion of residual gas available. Molecules of the residual gas are ionized by high-field ionization via a focused laser beam, which is guided parallel to the sample surface and which is focused just above the sample surface in the vicinity of the point of incidence of the primary particle beam or in the vicinity of the charged sample regions.

BRIEF DESCRIPTION OF THE DRAWINGS

Exemplary embodiments of the disclosure are explained below on the basis of figures.

DETAILED DESCRIPTION

Figure 1:
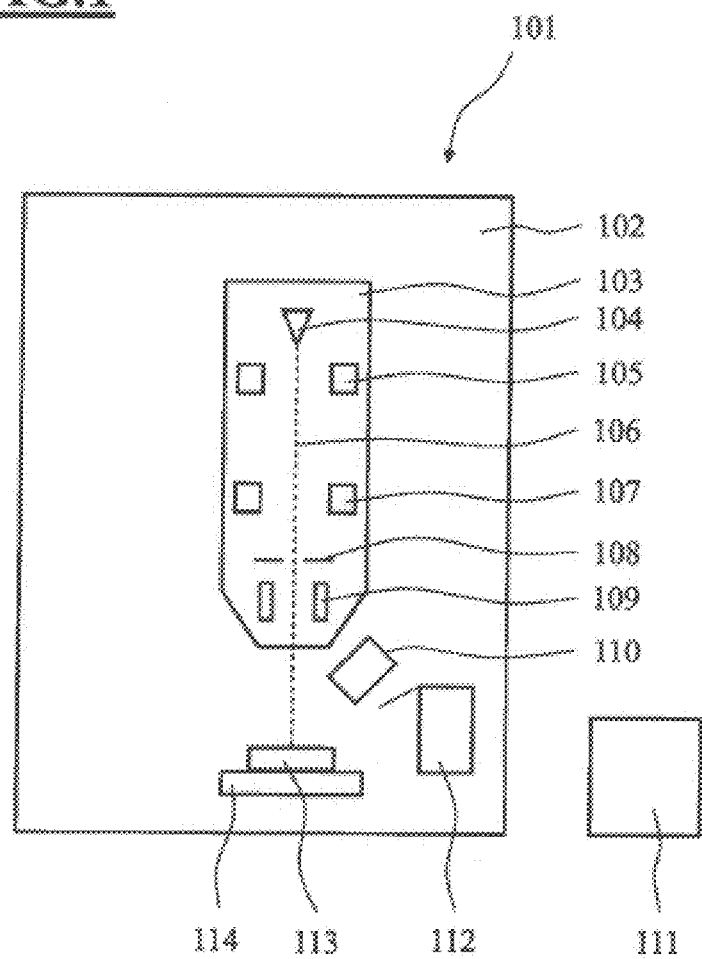
FIG. 1 schematically shows a device that is suitable for carrying out an embodiment of the method according to the disclosure.

Using the example of the scanning electron microscope (SEM), FIG. 1 shows a particle-optical device 101 that is suitable for carrying out a first embodiment of the method according to the disclosure. However, the embodiment of the disclosure is not restricted to scanning electron microscopes; instead, it can also be carried out using different particle-optical devices, e.g. ion microscopes.

The particle-optical device 101 shown in FIG. 1 includes an electron source 104, which is situated in an electron-optical column 103 and which is able to generate a primary particle beam, in this case a primary electron beam. The primary particle beam is a beam of charged particles, an electron beam in the present example.

The sample 113 is situated on a sample stage 114 within a sample chamber 102, which is embodied to receive a sample and in which vacuum conditions prevail. The sample stage 114 is embodied in such a way that it is displaceable in a plurality of directions, preferably at least in the three mutually orthogonal spatial directions x, y and z perpendicular and parallel to the optical axis 106 of the electron-optical column 103.

The primary particle beam is directed to the sample 113, accelerated along the optical axis 106 of the electron-optical column 103, focused by the lens systems 105, 107 and trimmed by at least one aperture stop 108. Moreover, the electron-optical column 103 includes a deflection system 109, with the aid of which the primary particle beam can be guided over the sample surface in a defined manner, for example line-by-line, which is referred to as "scanning."

When particles of the primary particle beam are incident on the surface of the sample 113, interaction products, e.g. secondary electrons (SE), are released due to interactions between the incident particles and the sample material and these can be detected with the aid of a detector. To this end, the particle-optical device includes at least a first detector 110. An image of the sample can be generated from the signals detected by the detector 110 by way of an evaluation and control unit 111.

Since the primary particle beam is guided step-by-step over the sample surface, different locations on the sample are irradiated, and so interaction products are emitted at the irradiated location in each case. Image information about the respective sample location is obtained by detecting the interaction products, wherein the image information can be represented as an image point (pixel).

By way of example, the primary particle beam can be scanned line-by-line over the sample (line scan). This means that the primary particle beam is guided over the sample surface along a single line. After arriving at the line end, the primary particle beam is guided to the start position of the next line and the primary particle beam subsequently scans along this next line. Line-by-line scanning is carried out with a selectable scanning frequency, and so a predetermined number of lines are scanned in each case per unit time. It is also conceivable for a number of lines to be scanned directly in succession.

However, scanning is not restricted to line-by-line scanning. It is also conceivable for the primary particle beam to be guided over the sample in a spiral shape or in a meandering shape or in any other shape. It is also conceivable to subdivide the entire image field to be scanned into individual defined sub-blocks. Then, the sample regions corresponding to the individual sub-blocks are scanned successively by the primary particle beam, wherein the sequence can be set arbitrarily. The individual scans of the sub-blocks can then be merged to form an overall image of the sample, taking into account the positions of the sub-blocks in the image field.

Moreover, the particle-optical device 101 includes a gas introduction device 112, which includes a needle, which may be embodied as a gas cannula and by which gaseous substances can be guided into the sample chamber. The gas introduction device 112 moreover includes a reservoir for storing the gas to be introduced and a line which connects the reservoir and the cannula to one another. The line includes a microvalve, by which the introduction of the gas can be controlled. To this end, the microvalve can assume at least two switching states, namely an "open" switching state, in which gas flows through the gas cannula and the latter is therefore introduced into the sample chamber, and a "closed" switching state, in which the gas flow through the gas cannula is prevented.

Advantageously, the microvalve can be switched with a switching time of less than 200 μs. It is particularly advantageous if the microvalve is switched in 100 μs or less. This therefore means that the microvalve can switch from the closed into the open switching state or from the open into the closed switching state within 200 μs or 100 μs, respectively. Therefore, it is possible to introduce the gas into the sample chamber in a pulse-like manner.

Preferably, the gas introduction device is embodied in such a way that at least the gas cannula is displaceable within the sample chamber. As a result of this, the opening of the gas cannula is positionable at different positions, and so the gas can be introduced in a targeted manner at predetermined locations in the vicinity of the sample or directly at the sample surface.

The disclosure is explained on the basis of FIG. 1 for the case where the particle-optical device, by which the disclosure is carried out, is an electron beam apparatus. However, the disclosure can also be carried out by an ion beam apparatus or a two-beam microscope. Moreover, the particle-optical device can also be embodied as a multi-beam apparatus, in which a multiplicity of particle beams, e.g. electron beams, scan the sample simultaneously.

A two-beam microscope is understood to be a combination apparatus made of electron beam apparatus and ion beam apparatus. A two-beam microscope includes two radiation sources able to generate primary particle beams, namely an electron source, which is situated in an electron-optical column and is able to generate an electron beam, and an ion source, which is situated in an ion-optical column and is able to generate an ion beam.

In principle, ion beam apparatuses and electron beam apparatuses have a similar design. However, in contrast to electron beam apparatuses, ion beam apparatuses have an ion source instead of an electron source and only include electrostatic lenses in place of magnetic lenses or combined electrostatic-magnetic lenses. Moreover, depending on the polarity of the ions, the polarities of the potential differences and potentials applied to the various components are naturally adapted accordingly.

Figure 2:
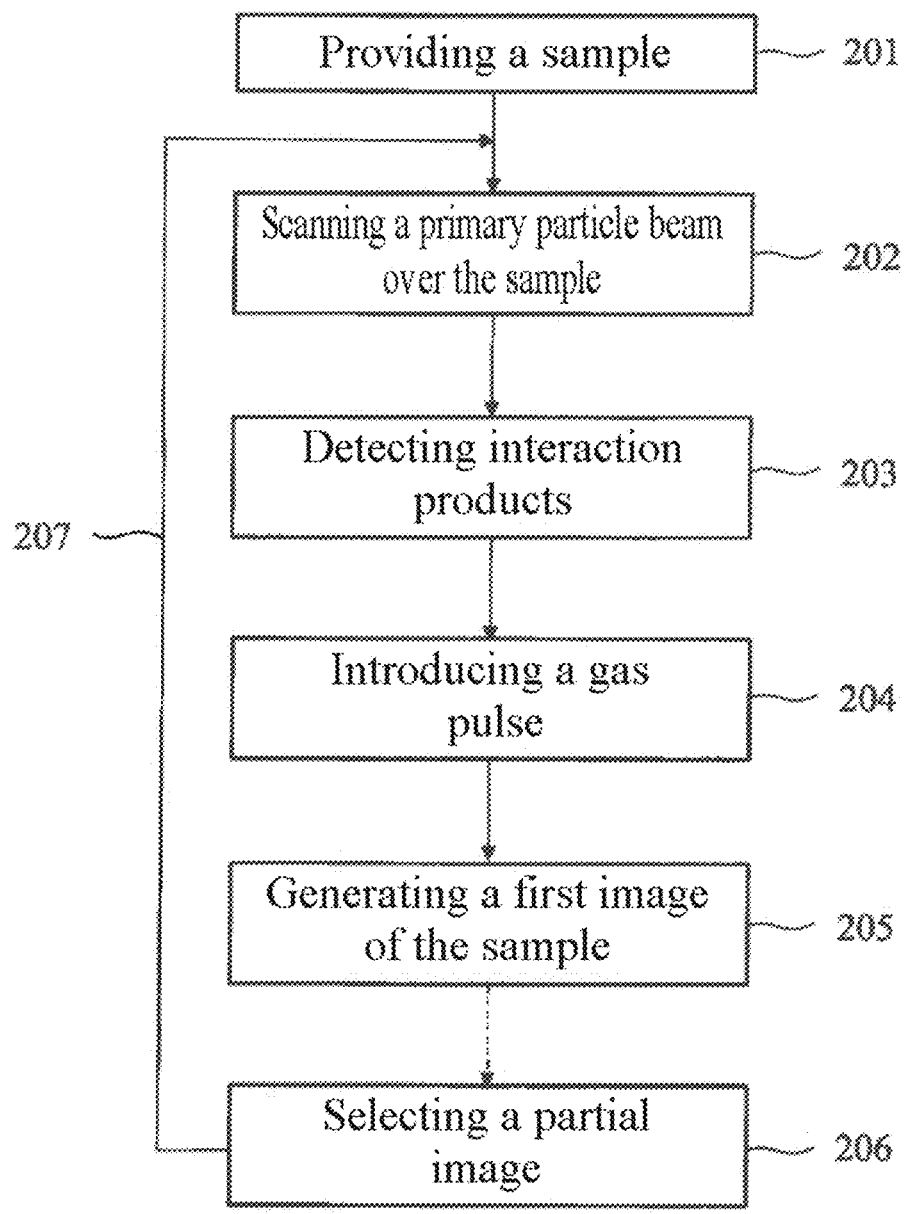
FIG. 2 shows a flowchart of an embodiment of the disclosure.

FIG. 2 shows a flowchart of a first embodiment of the method according to the disclosure. A sample which has at least one sample surface is provided in step 201. To this end, the sample to be examined is introduced into the sample chamber of the particle-optical device, for example a scanning electron microscope, and positioned on a sample stage below the objective lens.

Then, in step 202, the primary particle beam is scanned over the sample surface of the sample such that interaction products, which are released from the sample, are generated. This occurs for the duration of a first time interval $I_1$.

In step 203, the emitted interaction products are detected with the aid of one or more detectors. By way of example, these interaction products can be secondary electrons (SE) or backscattered electrons (BSE).

Then, gas is introduced into the sample chamber during a time interval $I_2$ by way of the gas introduction device of the particle-optical device (step 204), wherein the time interval $I_2$ overlaps with the time interval $I_1$. Charging of the sample can occur if the sample is irradiated by a primary electron beam. The overlap of time interval $I_2$ with time interval $I_1$ in time causes gas molecules to be present on the sample surface at the same time as the irradiation. The charged particles of the primary particle beam or the interaction products are incident on neutral gas molecules that are present, and so gas molecules are ionized, for example by impact ionization, and hence a sufficient number of charged gas particles and also electrons is generated in order to discharge the sample. If an electron beam is used as primary particle beam, charged gas particles in the form of positive ions and electrons are created. The electrons generated during the gas ionization are repelled by the negatively charged sample surface. At the same time, the positive gas ions are attracted by the negatively charged sample surface and they bring about charge balancing such that the sample is neutralized.

It was found to be advantageous if the time interval $I_2$ only has a duration of e.g. approximately 100 ms. This therefore means that the microvalve for introducing the gas is only open for the duration of the time interval $I_2$, and so gas in the form of a short gas pulse is therefore guided into the vicinity of the sample. By way of example, the gas pulse has a duration of less than 100 ms.

In principle, the gas introduced in this manner is removed from the sample chamber after a certain amount of time by the activity of the vacuum pumps, which evacuate the sample chamber. The pulse-shaped introduction of gas is advantageous in that the volume of the gas introduced overall remains small and hence the pumps of the vacuum system are put under less strain. Moreover, this minimizes unwanted interactions with secondary electrons.

Expediently, the gas cannula is positioned in such a way that the opening of the gas cannula is situated at a distance of one millimeter or less from the sample surface, preferably at a distance of between 1000 µm and 10 µm such that the outflowing gas molecules are distributed directly over the sample surface.

The introduced gas can be any suitable gas, for example nitrogen, oxygen or gaseous water. It can be advantageous to use an inert gas such as nitrogen or a noble gas. This is advantageous in that the gas molecules do not react chemically in an unwanted manner with the sample material or other materials present in the sample chamber.

A first image of the sample is generated in step 205 on the basis of the detected interaction products. Since the time interval $I_1$ and the time interval $I_2$ overlap, a sample region is initially imaged during the acquisition of an image, which sample region is slowly charged due to the irradiation by the primary particle beam such that charge artifacts are present in the image. Then there is the gas pulse, which is visible in the image as a detector signal shooting thereover. The image regions recorded after the introduction of the gas no longer have charging and are therefore suitable for being selected as a partial image in the subsequent step.

A partial image is selected from the image of the sample in step 206. This is carried out in such a way that only image regions with a good image quality are selected. Image regions in which charging artifacts are depicted or in which the gas pulse is visible should not be selected.

Steps 202 to 206 are repeated at least once in an optional step 207. Here, the time interval $I_1$ repeats with a period $T_1$, while the time interval $I_2$ repeats with a period $T_2$, wherein the two periods have different lengths. A partial image is also selected in the image generated now during the repetition of steps 202 to 206, and so the various partial images can be combined to form a composite image of the sample.

The method according to the disclosure is advantageous in that the discharging phase and the image recording phase can be separated from one another due to the discontinuous, preferably pulse-shaped, introduction of gas and the defined sequence of method steps in time. What is avoided as a result of this is that interfering gas molecules are present in the vicinity of the sample surface when an image region is recorded, the image of which is subsequently intended to be selected as partial image.

Figure 3:
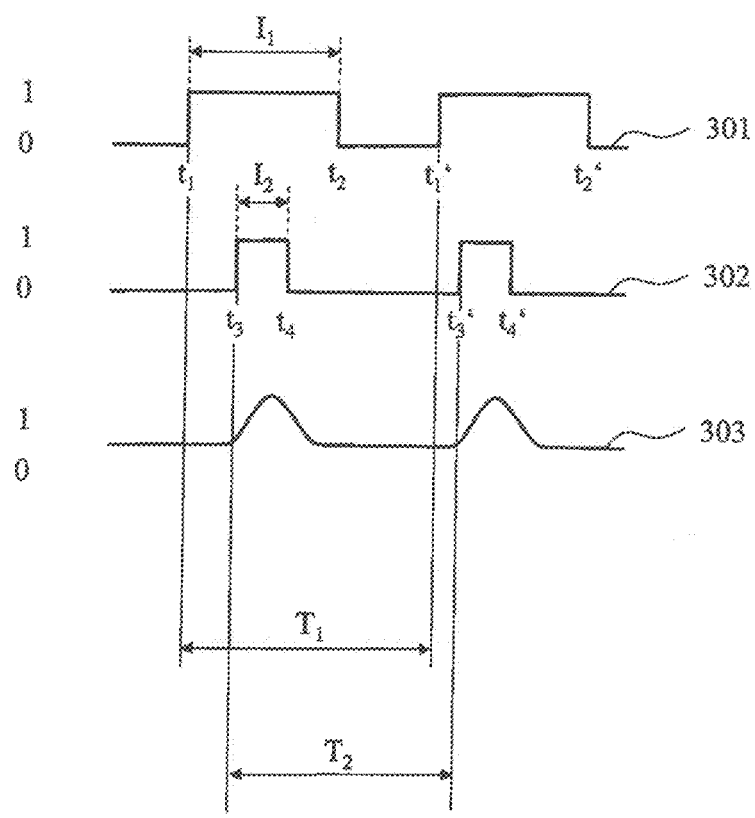
FIG. 3 schematically shows the progress of method steps, which are plotted over a time axis.

To clarify the first embodiment of the method according to the disclosure, described until now, FIG. 3 depicts the sequence of the time intervals mentioned in the description relating to FIG. 2 in time. A time interval is understood to mean a portion of time with a specific duration. Each time interval starts at a specific time and ends at another time. The time span between the start and end time defines the duration of the time interval.

FIG. 3 depicts method steps 202 and 204 schematically in the form of curves 301, 302 and 303, which are plotted over the time axis (abscissa). In this schematic illustration, the ordinate label "0" marks the switched-off or closed state and the ordinate label "1" marks the switched-on or open state.

Curve 301 represents the irradiation of the sample surface via the primary particle beam. The primary particle beam is directed onto the sample surface (state "1") for the duration of the time interval $I_1$. Here, the primary particle beam can be guided over the region of the sample to be irradiated in many different ways, for example in lines, sine waves or in meanders. Preferably, the primary particle beam is guided over the sample in the scanning mode conventional for the specific application. The time interval $I_1$ starts at a time $t_1$ and ends at a time $t_2$.

The sample is no longer irradiated (state "0") after the end of the time interval $I_1$. However, it is also conceivable for the primary particle beam to continue to be directed to the sample after the end of the time interval $I_1$ if the interaction products created in the process are not detected or—if the interaction products are detected—for the signals detected then not to be used however to generate an image.

The introduction of gas during the time interval $I_2$ is elucidated by the curves 302 and 303. Curve 302 represents the switching state of the microvalve. It can either be in the open (1) or closed (0) switching state. In the open state, gas flows through the microvalve and it is introduced into the sample chamber by way of a cannula. The microvalve is in the open state for the duration of the time interval $I_2$.

The time interval $I_2$ overlaps with the time interval $I_1$ in time. The time interval $I_2$ starts at a time $t_3$ and ends at a time $t_4$, wherein the time $t_3$ is advantageously after the time $t_1$ and before the time $t_2$ in time such that, therefore, the time interval $I_2$ overlaps with the time interval $I_1$, in particular such that the time interval $I_2$ lies completely within the time interval $I_1$.

As a consequence, the scanning of the primary particle beam over the sample and the introduction of the gas are carried out at the same time from time to time. What is decisive in this case is that both gas molecules and primary particles and/or secondary electrons are present in the vicinity of the sample surface such that charged gas particles and electrons which are able to neutralize the sample charging can be created.

After the time interval $I_2$ has elapsed, the microvalve is in the closed state. It was found to be advantageous if the microvalve is only open for short period of time, i.e. for several hundred milliseconds or less than 100 ms, for example for 50 µs, such that the gas is introduced in the form of a gas pulse.

The curve 303 represents the flow of the gas emitted into the gas cannula through the microvalve. The curve profile of the curve 303 at the same time also corresponds to the flow of the gas output by the gas cannula in the direction of the sample. The local partial pressure, which is generated at the sample surface by the gas output by the gas cannula, also follows a similar time profile as the curve 303.

In an advantageous refinement, the irradiation of the sample with the primary particle beam, the detection of interaction products and the introduction of gas are repeated. Here, the time interval $I_1$ is repeated with the period $T_1$, while the time interval $I_2$ is repeated with the period $T_2$, wherein the periods $T_1$ and $T_2$ have different lengths. What is achieved hereby is that the introduction of the gas always takes place at a different time after the start of the image recording cycle, and so the zone of the ideal sample discharge migrates over the sample and it is localized at a different sample location at each image acquisition.

Preferably, the duration of the time intervals described above lies in the range of milliseconds or microseconds. In order to bring about the sequence of the various time intervals in time, it was found to be advantageous if the scan generator of the particle-optical device or the microvalve of the particle-optical device is used as a clock generator. This means that the scan generator is embodied to control the sequence of the time intervals of the method steps in time as a clock generator (master). In this case, the microvalve is embodied to be controlled by a clock generator within the meaning of a slave. Alternatively, the microvalve is embodied to control the sequence of the time intervals of the method steps in time as a clock generator (master); in this case, the scan generator in particular is embodied to be controlled within the meaning of a slave by an external clock generator.

Figure 4:
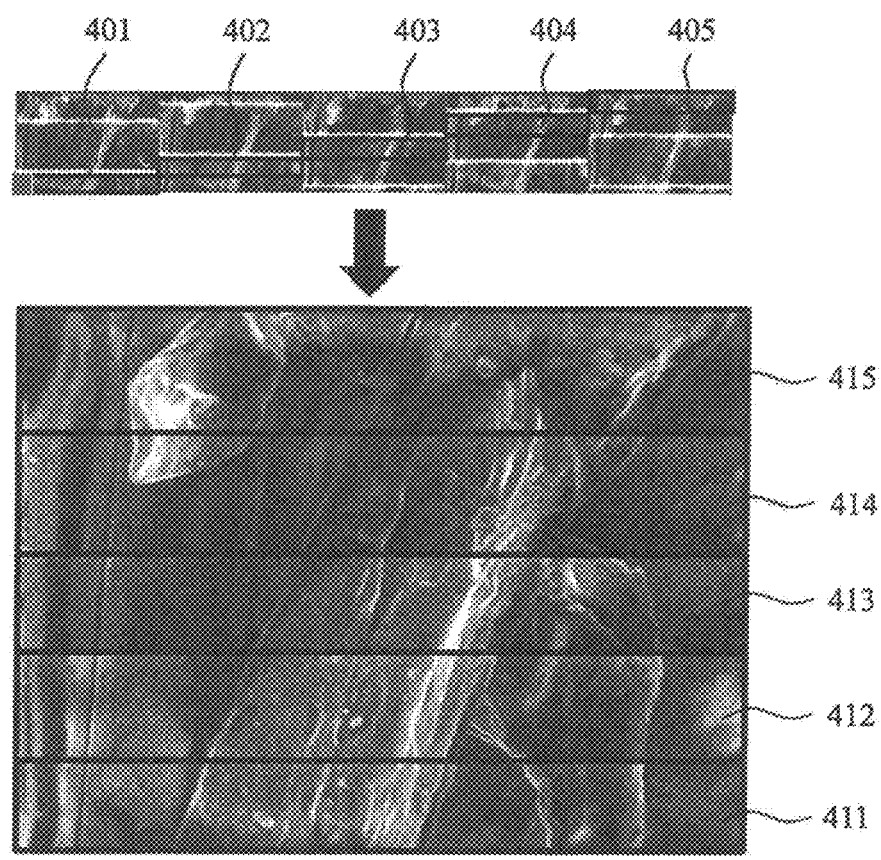
FIG. 4 shows an image of a sample made by scanning electron microscopy as an example of an application.

FIG. 4 shows an example of an application. The upper part of FIG. 4 depicts five images of the sample arranged next to one another, wherein a gas pulse—identifiable at the so-called discharge zones—was introduced twice in each case per recorded image. The discharge zones are visible as bright stripes in the respective image. They correspond to the zones on the sample area over which the particle beam is scanned during the introduction of the gas in the time interval $I_2$.

Those portions 401, 402, 403, 404, 405 which respectively do not have image interference, i.e. no charging artifacts and no imaging of the discharge zones, are selected and cut out of the images. The lower part of FIG. 4 shows an image of the sample composed from the selected partial images 401, 402, 403, 404, 405, wherein the edges of the original partial images are characterized by separation lines in this illustration in order to provide a better explanation, and so five individual partial images 411, 412, 413, 414, 415 are identifiable in the composite image, wherein 411 corresponds to the original partial image 401, 412 corresponds to the original partial image 402, etc.

Figure 5:
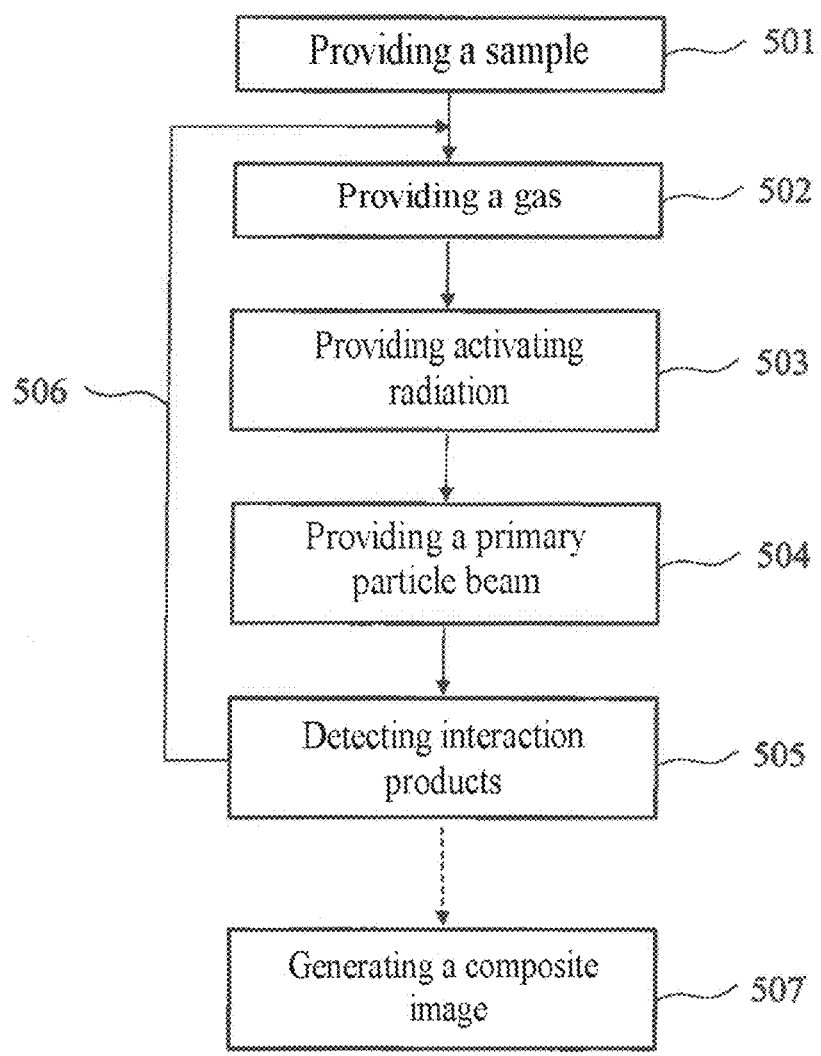
FIG. 5 shows a flowchart of an embodiment of the disclosure.

The present disclosure can also be embodied in a further embodiment, which in turn can be reflected in various refinements. FIG. 5 depicts this embodiment in a flowchart.

A sample is provided in step 501, wherein the sample has at least one sample surface. Then, gas is provided (step 502). In a first advantageous refinement, the gas is introduced in the form of a molecular beam into the vacuum chamber. Alternatively, residual gas can be used in a second advantageous refinement, which residual gas is situated in the vacuum chamber. Activating radiation is provided in step 503. A primary particle beam, i.e., for example, a primary electron beam or a focused ion beam, is used to this end in the first advantageous refinement. Laser radiation is used to this end in another advantageous refinement. However, the provision of activating radiation is not mandatory since gas ions can also form spontaneously by thermal collision processes of the gas molecules amongst themselves or by thermal collision processes of the gas molecules with mechanical surfaces of the sample chamber or the sample.

A primary particle beam which scans the sample surface is provided in step 504. It is also conceivable that the provision of the activating radiation 503 and the provision of the primary particle beam 504 are combined into one method step.

Interaction products are detected in step 505.

Steps 502 to 505 are repeated in an optional refinement of the method (step 506). A composite image is generated in a further optional refinement (step 507).

Figure 6:
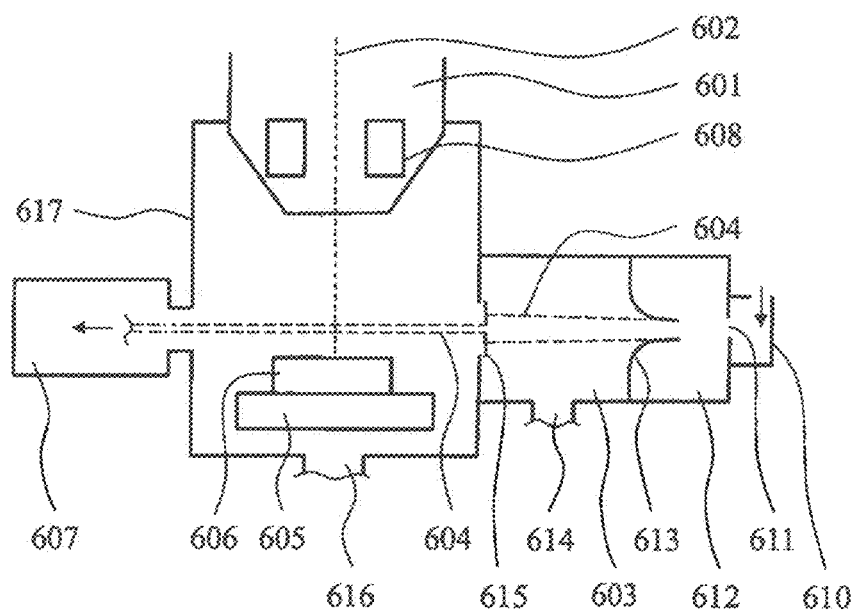
FIG. 6 schematically shows a device that is suitable for carrying out a special refinement of the method according to the disclosure.
Figure 7:
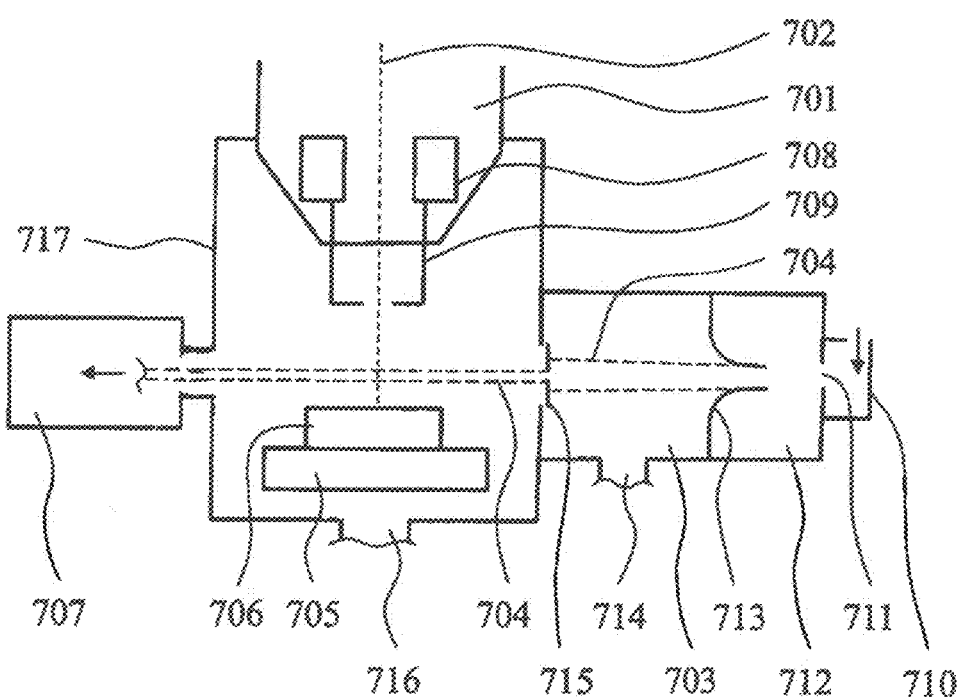
FIGS. 7 and 8 schematically show further devices that are suitable for carrying out special refinements of the method according to the disclosure.
Figure 8:
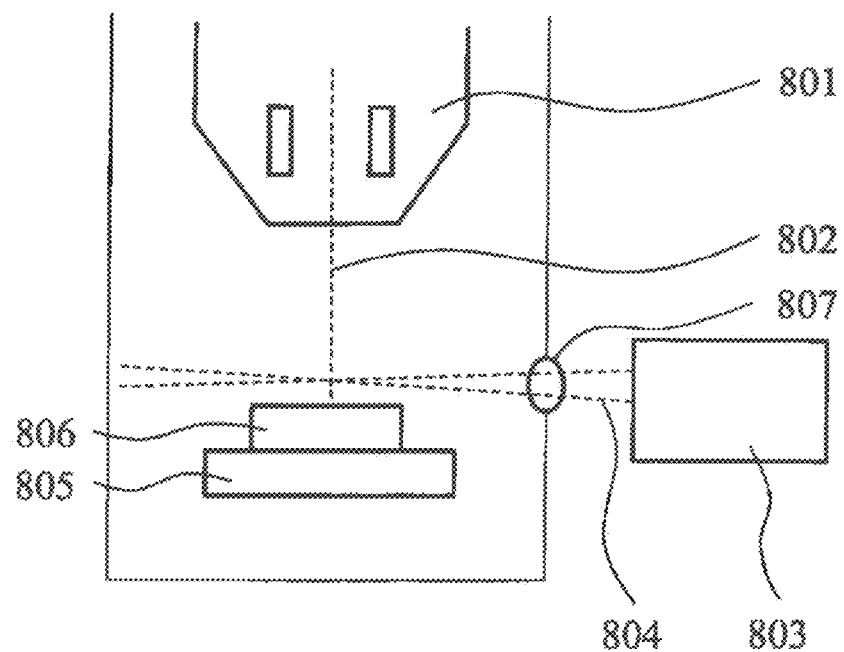

FIGS. 6, 7 and 8 show particle-optical devices that are suitable for carrying out the refinements of the second embodiment of the method according to the disclosure.

An advantageous refinement can be carried out with a specially embodied particle-optical device. This particle-optical device substantially includes the elements described in FIG. 1 and the associated description. FIG. 6 therefore schematically shows only part of the particle-optical device, wherein, in particular, the different refinement of this device in contrast to the device described in FIG. 1 is illustrated.

The particle-optical device shown in FIG. 6 includes a sample stage 605, which is situated in the sample chamber below the objective 601 and on which a sample 606 can be received. The objective 601 has an objective lens 608 and an optical axis 602. Moreover, the particle-optical device includes a mechanism for generating a molecular beam, which include a gas inlet 610, an expansion nozzle 611 and a skimmer 613. The expansion nozzle 611 advantageously has a small aperture, the diameter of which is e.g. between 1 μm and 100 μm.

The particle-optical device advantageously furthermore includes connections 614 to a second pump stage and to a further vacuum pump 616. Moreover, the device includes at least one reservoir for storing the gas to be introduced and at least one line, by which the gas can be guided from the reservoir to the sample chamber, in order to guide the gas in the form of the molecular beam into the sample chamber.

It is particularly advantageous if the line includes a microvalve. Here, the microvalve should be configured in such a way as was already described above. It is particularly advantageous if the expansion nozzle is coupled to the microvalve. Gases which are usually used for charge compensation, such as e.g. noble gases, nitrogen or oxygen, i.e., in particular, gases which have a chemically inert behavior, are suitable.

In the method in accordance with the first refinement of this embodiment of the disclosure, the sample 606 to be examined is provided on the sample stage 605 below the objective 601. A primary particle beam, which is accelerated along the optical axis 602 and directed to the sample 606, is generated with the aid of a particle beam source (not depicted here).

The mechanism for generating a molecular beam generates a directed beam from the fast-moving gas molecules, which can be considered to be a molecular beam 604. To this end, gas at high pressure, which can be several bar, is expanded into the evacuated chamber by way of the gas inlet 610 and the expansion nozzle 611. The laminar part of the gas flow is cut out of the forming Mach cone with the aid of the skimmer 613, which projects into this expansion cone in front of the shock front. The skimmer 613 serves as a differential pressure stage 612, i.e. the gas molecules which do not reach the sample chamber through the skimmer 613 are pumped away from the pressure stage 612 with the aid of a turbomolecular pump or another suitable pump.

Since the gas is cooled laterally to a temperature of a few tens to several Kelvin as a result of the supersonic expansion and since it has a very narrow temperature distribution in the longitudinal direction, i.e. in the direction of propagation of the molecules, there are only a few collisions between the molecules in the skimmed, laminar gas jet behind the skimmer 613. Therefore, the laminar gas flow passing through the skimmer 613 propagates linearly, i.e. the diameter of the gas flow at each position is substantially given by the dimensions of the nozzle 611 and the diameter of the skimmer 613, and by the ratio of the distances of the skimmer 613 and the nozzle 611 and the desired position.

Thus, the laminar part of the gas beam can be cut out with the aid of the skimmer 613. A laterally cold molecular beam with a divergence of less than 10°, preferably less than 5° or 1°, is obtained. The molecular beam 604 generated thus is guided over a perforated stop 615 and skimmed a second time thereby and finally introduced into the sample chamber 617. Here, linear propagation conditions apply again, i.e. the diameter of the gas jet at the sample surface is determined by the size of the perforated stop, the nozzle and the respective distances of perforated stop, expansion nozzle and sample.

Pressures of $10^{-4}$ mbar, preferably $10^{-3}$ mbar or higher, are achieved within the gas jet 604 while the particle density outside of the beam is given by the pressure of the vacuum chamber (typically $10^{-6}$ mbar or less) at the same time. Here, the gas jet 604 is preferably guided past the sample and directed to a further pump—for example a turbomolecular pump—, which serves as a suction device 607 and suctions away the particles. As a result of this, it is possible to generate local higher particle densities.

It is also conceivable to skim the gas jet a third time prior to the entry into the sample chamber. As result, the local excess pressure can be increased.

The charge compensation can take place if the gas jet 604 is now guided just over the sample surface in a manner perpendicular to the electron beam and parallel to the sample surface, directly at the location of incidence of the electron beam. What is advantageous here is that the directed, laminar, transverse cold particle beam only increases the partial pressures in the sample chamber and in the electron column insubstantially.

In the process, the gas particles in this gas jet 604 can be moving with speeds of several hundred meters per second. It was found to be advantageous if the gas molecules in the molecular beam 604 have a relative kinetic energy which is substantially uniform in the z-direction, i.e. in the direction of propagation of the gas jet, and which is close to 0 in the directions x and y orthogonal to the z-direction.

The molecular beam 604 is aligned in such a way that it extends between the objective 601 and the surface of the sample 606 such that ions, which are suitable for compensating the charging of the sample, are generated by interaction processes. In an advantageous manifestation of the disclosure, the molecular beam extends substantially parallel to the sample surface. What this avoids is that the gas molecules in the molecular beam are scattered. It is also conceivable for the molecular beam to have grazing incidence on the surface of the sample 606, i.e. under a flat angle of incidence of 0.1° to 10° between the molecular beam and the surface of the sample 606, particularly preferably under an angle of incidence of 0.1° to 5°.

The molecular beam is cooled strongly, for example to a temperature of between 20 K and 40 K, due to the expansion of the gas beam after the emergence from the nozzle. This is advantageous in that the beam diameter is kept small and a widening of the beam as a result of thermal effects is avoided or kept as small as possible.

The molecular beam can be introduced continuously into the sample chamber. However, it is also conceivable that the molecular beam is introduced in a discontinuous manner, for example in a pulsed manner. To this end, the gas collisions should be matched to the scanning frequency of the primary particle beam such that the particles of the primary particle beam and the gas particles of the gas pulse collide so that gas ionization can take place. To this end, the opening/closing frequency of the microvalve should be matched to the scanning frequency of the primary particle beam. It is also possible to use the scan generator of the particle-optical device as a clock generator (master). Alternatively, the switching state of the microvalve can be used as clock generator (master).

Figure 9:
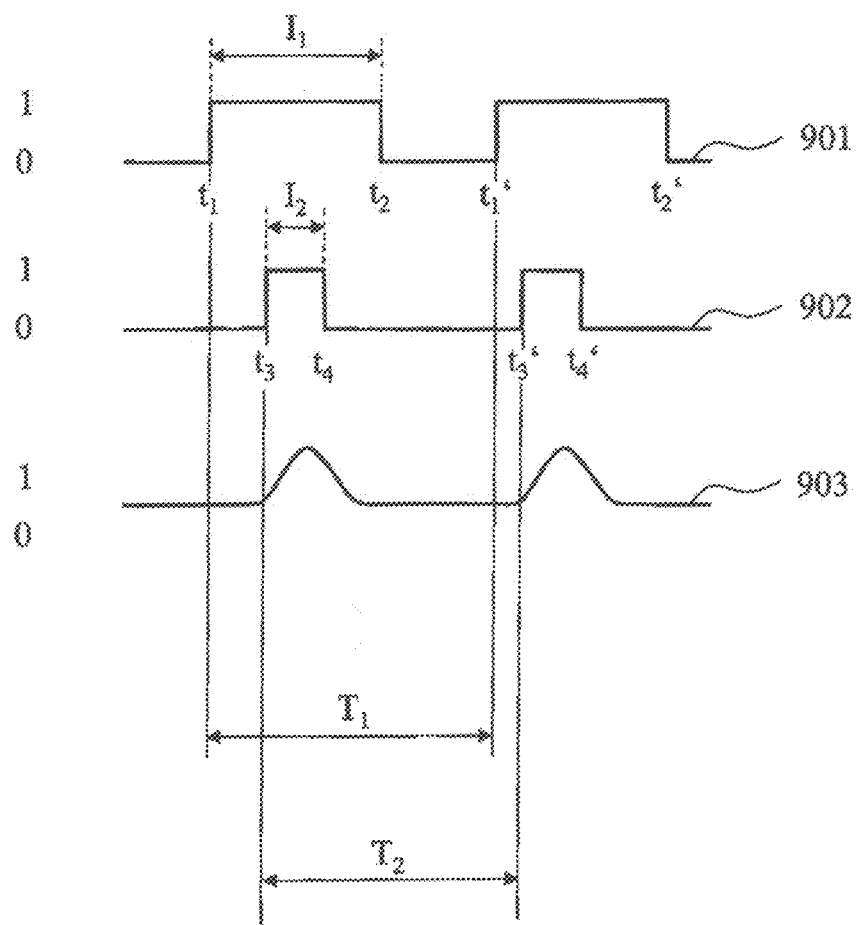
FIG. 9 schematically shows the progress of method steps, which are plotted over a time axis.

FIG. 9 shows—in a manner analogous to FIG. 3—the time profile of the irradiation via the primary particle beam (curve 901) and the introduction of the molecular beam during the time interval $I_2$ (curves 902 and 903). The primary particle beam is directed to the sample surface (state "1") for the duration of the time interval $I_1$. As described for FIG. 3, the primary particle beam can be guided over the sample surface in many different ways in this case.

The sample is no longer irradiated (state "0") after the end of the time interval $I_1$. However, it is also conceivable for the primary particle beam to continue to be directed to the sample after the end of the time interval $I_1$ if the interaction products created in the process are not detected or—if the interaction products are detected—for the signals detected then not to be used however to generate an image.

The curve 902 represents the switching state of the microvalve. It can either be in the open (1) or closed (0) switching state. In the open state, gas flows through the microvalve and it is introduced into the sample chamber as a molecular beam. The microvalve is in the open state for the duration of the time interval $I_2$.

The curve 903 represents the flow of the gas output into the gas cannula through the microvalve. The curve profile of the curve 903 at the same time also corresponds to the flow of the molecular beam.

As already described for FIG. 3, the time interval $I_2$ overlaps in time with the time interval $I_1$. As a consequence, the scanning of the primary particle beam over the sample and the introduction of the molecular beam are carried out at the same time from time to time. As a result, both gas molecules and primary particles and/or secondary electrons are present in the vicinity of the sample surface such that charged gas particles and electrons, which are able to neutralize the sample charging, can be created. After the time interval $I_2$ has elapsed, the microvalve is in the closed state. The time intervals $I_1$ and $I_2$ can also be partly or completely disjointed.

In an advantageous refinement, the irradiation of the sample with the primary particle beam, the detection of interaction products and the introduction of the molecular beam are repeated. Here, the time interval $I_1$ is repeated with the period $T_1$, while the time interval $I_2$ is repeated with the period $T_2$, wherein the time intervals $T_1$ and $T_2$ can have different lengths such that the zone of the ideal sample discharge migrates over the sample and it is localized at a different sample location at each image acquisition. Alternatively, it is also possible for the period $T_1$ and the period $T_2$ to have the same length and for there to be no image acquisition during the irradiation.

During the pulsed introduction of the molecular beam, the microvalve is opened for several hundred milliseconds in order to introduce the molecular beam as a pulse. It is also conceivable for the microvalve to be open only for a few hundred microseconds. The opening time depends on various factors, e.g. the pressure with which the expansion nozzle is loaded and on the diameter thereof, the diameter usually being between 10 μm and 40 μm. Furthermore, further parameters, such as gas temperature, gas type and pump power of the various pressure stages, can have an effect on the length of the opening time.

In order to bring about the sequence of the various time intervals in time, it was found to be advantageous if the scan generator of the particle-optical device or the microvalve of the particle-optical device is used as a clock generator. This means that the scan generator is embodied to control the sequence of the time intervals of the method steps in time as a clock generator (master). Alternatively, the microvalve is embodied to control the sequence of the time intervals of the method steps in time as a clock generator (master). As already described further above, the microvalve in the first case and the scan generator in the second case are then embodied to be controlled by an external clock generator within the meaning of a slave.

FIG. 7 depicts a particular embodiment of the present disclosure, which relates to electron microscopes with immersion lenses, i.e. electron microscopes in which the sample is localized within the electric and/or magnetic field of the objective. The particle-optical device corresponds to the device that is depicted in FIG. 6 and described in the associated description.

The particle-optical device includes a sample stage 705 for receiving a sample 706, which in the sample chamber below the objective 701. The objective includes an optical axis 702. Moreover, the device has a mechanism for generating a molecular beam (analogous to the description of FIG. 6), to be precise a nozzle 711, a skimmer 713, which is localized in a first pump stage 712, a stop 715 and a suctioning device 707 for suctioning the molecular beam 704 and a plurality of pump stages 714, 716. Furthermore, the particle-optical device additionally includes an extraction electrode 709, by which a voltage can be applied to the objective lens such that an electrostatic immersion field can be generated between the sample 706 and the objective lens 708, which immersion field can be switched on and off quickly. Moreover, the device includes connections to a second pump stage 714 and to a further vacuum pump 716.

By way of example, a potential of −28 kV is applied to the objective lens 708 while the sample 706 has a potential of −30 kV. What this extraction field achieves is that, firstly, the primary electrons are decelerated to the desired landing energy and that, secondly, the formed secondary electrons are accelerated toward the detector. The immersion field can be switched on or switched off, wherein it is possible to switch between these two states with a switching time of several microseconds, for example 200 µs or less, as is described, for example, in WO2012041464 A1.

It was found to be particularly advantageous if the extraction voltage is switched on and off alternately with the primary particle beam. What this means is that the extraction voltage is only applied when the primary particle beam is switched on. If products of the interaction between primary particle beam and sample are intended to be detected, the extraction field should be switched on. If no interaction products are detected, it is irrelevant as to whether the extraction field is switched on or off.

However, the microvalve is only opened if the extraction field is switched off. The extraction field is only reapplied once the microvalve is closed and hence no more gas is introduced. When the microvalve is open, the primary particle beam is directed to the sample.

What is advantageous in this refinement is that the charge compensation is made possible during the sample imaging with the aid of electrostatic immersion lenses, with only a small gas load being built up in the vacuum system of the particle-optical device as the molecular beam remains restricted to a small volume. By switching off the extraction field during the gas pulse, arcings as a result of ionized particles, which would otherwise be accelerated in the extraction field, are avoided. Moreover, there is no need for cannulas or similar components in the vicinity of the objective lens or of the sample surface.

In a further alternative embodiment of the method, use is made of the fact that an absolute vacuum never prevails in the sample chamber of the particle-optical device, but that instead there always is a certain portion of residual gas present. Molecules of the residual gas are generated by high-field ionization via a focused laser beam, which is guided parallel to the sample surface and which is focused just above the sample surface in the vicinity of the location of incidence of the primary particle beam or in the vicinity of the charged sample regions.

This is preferably carried out at a local power density of $10^{10}$ W/cm$^2$ to $10^{13}$ W/cm$^2$ or $10^{14}$ W/cm$^2$, which can be achieved by sufficiently short laser pulses (in the nanosecond, picosecond or femtosecond range). The generated free charge carriers in the form of positive ions or electrons can experience charge compensation by way of the same mechanism as in the gas ionization method. In this case, it is advantageous to briefly switch the detectors to blind for the time of the laser pulse.

This alternative embodiment of the method can be carried out with a further specially embodied particle-optical device. Such a particle-optical device is depicted in FIG. 8 and it substantially includes the elements described in FIG. 1 and the associated description. FIG. 8 therefore only schematically shows part of the particle-optical device which represents the different refinement of this device in contrast to the device described in FIG. 1.

The device shown in FIG. 8 includes an objective 801 with an optical axis 802, a sample stage 805, which is situated in the sample chamber and on which a sample 806 can be received. Moreover, the device includes a laser device 803 for generating a laser beam 804, wherein the device 803 advantageously has a lens 807.

What is advantageous in relation to this refinement is that no devices for introducing gas need to be present, since residual gas is present in the sample chamber of the particle-optical device. Usually, residual gas of the order of $10^{-4}$ to $10^{-8}$ mbar is present in the vacuum chamber.

The employed laser device 803 can include a pulsed laser, for example a pulsed solid-state laser. Alternatively, it is also possible to use a suitable laser of a different design, such as a gas laser or excimer laser. A laser able to generate a field strength enabling multi-photon photoionization of the residual gas is suitable.

In the method in accordance with this refinement of this embodiment of the disclosure, the sample 806 to be examined is provided on the sample stage 805 below the objective 801. A primary particle beam, which is accelerated along the optical axis 802 and directed to the sample 806, is generated with the aid of a particle beam source (not depicted here). The laser device 803 generates a directed laser beam 804. It was found to be advantageous if the laser beam 804 generated by the laser device 803 is focused. As a result of the action of the laser beam on the molecules of the residual gas, there is a formation of charged gas particles and electrons, which are able to neutralize electric charging of the sample, due to multi-photon photoionization.

It can be advantageous if the focused laser beam intersects the trajectory of the primary particle beam. However, this is not mandatory for as long as the trajectories come sufficiently close in space so that the charged particles find their way to the sample position which was charged, in order to bring about a discharge there.

In this refinement, it is also conceivable for it to be combined with a device with an electrostatic immersion lens, analogous to what was described in FIG. 7. Here, the extraction voltage is switched on and off alternately with the laser beam. This means that a laser pulse is only emitted if the extraction field is switched off. Conversely, the extraction voltage is only applied if no laser pulse is emitted.

It was found to be particularly advantageous if the detector is switched to blind during the laser pulse in order to protect it from high signals if work is undertaken without an immersion lens.

LIST OF REFERENCE SIGNS

101 Particle-optical device
102 Sample chamber
103 Electron-optical column
104 Electron source
105 First lens system
106 Optical axis of the electron column 107 Second lens system
108 Aperture stop
109 Deflection system
110 Detector
111 Evaluation and control unit
112 Gas introduction device
113 Sample
114 Sample stage
201 Step: providing a sample
202 Step: scanning the primary particle beam
203 Step: detecting interaction products
204 Step: introducing a gas
205 Step: generating an image
206 Step: selecting a partial image
207 Step: repeat
301 Irradiating the sample with a primary particle beam
302 Switching state of the microvalve
303 Gas flow through the microvalve/gas cannula
401 First partial image
402 Second partial image
403 Third partial image
404 Fourth partial image
405 Fifth partial image
411 First partial image in the composite image
412 Second partial image in the composite image
413 Third partial image in the composite image
414 Fourth partial image in the composite image
415 Fifth partial image in the composite image
501 Step: providing a sample
502 Step: providing a gas
503 Step: providing activating radiation
504 Step: providing a primary particle beam
505 Step: detecting interaction products
506 Step: repeating method steps
507 Step: generating a composite image
601 Objective of a particle-optical device
602 Optical axis
603 Second pump stage
604 Molecular beam
605 Sample stage
606 Sample
607 Suctioning device
608 Objective lens
610 Gas inlet
611 Expansion nozzle
612 First pump stage
613 Skimmer
614 Connection to the second pump stage
615 Stop
616 Connection to the vacuum pump
617 Sample chamber
701 Objective of a particle-optical device
702 Optical axis
703 Second pump stage
704 Molecular beam
705 Sample stage
706 Sample
707 Suctioning device
708 Objective lens
709 Extraction electrode
710 Gas inlet
711 Nozzle
712 First pump stage
713 Skimmer
714 Connection to the second pump stage
715 Stop
716 Connection to the vacuum pump
717 Sample chamber
801 Objective of a particle-optical device
802 Optical axis
803 Laser device
804 Laser beam
805 Sample stage
806 Sample
807 Lens
901 Irradiating the sample with a primary particle beam
902 Switching state of the microvalve
903 Gas flow of the molecular beam

What is claimed is:

1. A method, comprising:
a) scanning a primary particle beam over a surface of a sample for a duration of a time $I_1$;
b) introducing a gas pulse for a duration of time $I_2$, which overlaps with $I_1$, so that a region of the sample surface is discharged;
c) detecting interaction products of the primary particle beam and the sample during a) and b);
d) generating a first image of the sample on the basis of the detected interaction products; and
e) selecting a partial image from the first generated image so that image regions having image interference are not contained in the partial image,
wherein $I_2$ is less than 100 milliseconds.

2. The method of claim 1, wherein the method is performed using a particle-optical device, comprising:
a vacuum chamber housing the sample;
a particle source that generates the primary particle beam;
a scan generator that guides the primary particle beam over the sample surface; and
a detector that detects the interaction products.

3. The method of claim 1, further comprising:
f) repeating a) to c), a) being repeated with a period $T_1$ and c) being repeated with a period $T_2$ which is different from $T_1$;
g) generating a second image of the sample on the basis of the interaction products detected when repeating c);
h) selecting a partial image from the second generated image so that image regions having image interferences are not contained in the partial image; and
i) combining the partial image of the first image and the partial image of the second image to form a composite image of the sample.

4. A method, comprising:
a) scanning a primary particle beam over a surface of a sample for a duration of a time $I_1$;
b) introducing a gas pulse for a duration of time $I_2$, which overlaps with $I_1$, so that a region of the sample surface is discharged;
c) detecting interaction products of the primary particle beam and the sample during a) and b);
d) generating a first image of the sample on the basis of the detected interaction products; and
e) selecting a partial image from the first generated image so that image regions having image interference are not contained in the partial image,
wherein the method is performed using a particle-optical device, comprising:
a vacuum chamber configured to receive a sample;
a particle source configured to generate a primary particle beam;
a scan generator configured to guide the primary particle beam over a surface of the sample for the duration of time $I_1$;

a gas supply arrangement configured to introduce a gas into the vacuum chamber for the duration of time $I_2$, which overlaps with $I_1$, so that a region of the sample surface is discharged; and a detector configured to detect interaction products of the primary particle beam and the sample, and wherein at least one of the following holds:
the gas supply arrangement comprises a microvalve having a switching time of less than 100 microseconds;
the particle optical device further comprises a clock generator configured to control a sequence of $I_1$ and $I_2$,
the gas supply arrangement is configured to control a sequence of $I_1$ and $I_2$; and
the scan generator is configured to control a sequence of $I_1$ and $I_2$.

5. The method of claim 4, wherein the gas supply arrangement comprises a microvalve having a switching time of less than 100 microseconds.

6. The method of claim 4, further comprising a clock generator configured to control a sequence of $I_1$ and $I_2$.

7. The method of claim 4, wherein the gas supply arrangement is configured to control a sequence of $I_1$ and $I_2$.

8. The method of claim 4, wherein the scan generator is configured to control a sequence of $I_1$ and $I_2$.

9. The method of claim 4, wherein the particle-optical device comprises a scanning electron microscope.

10. The method of claim 4, wherein the particle-optical device comprises an ion beam microscope.

11. A method, comprising:
a) scanning a primary particle beam over a surface of a sample for a duration of a time $I_1$;
b) detecting interaction products of the primary particle beam and the sample;
c) introducing a gas pulse for a duration of time $I_2$, which overlaps with $I_1$, so that a region of the sample surface is discharged;
d) generating a first image of the sample on the basis of the detected interaction products; and
e) selecting a partial image from the first generated image so that image regions having image interference are not contained in the partial image,
wherein $I_2$ is less than 100 milliseconds.

12. The method of claim 11, wherein the method is performed using a particle-optical device, comprising:
a vacuum chamber configured to receive a sample;
a particle source configured to generate a primary particle beam;
a scan generator configured to guide the primary particle beam over a surface of the sample for the duration of time $I_1$;
a gas supply arrangement configured to introduce a gas into the vacuum chamber for the duration of time $I_2$, which overlaps with $I_1$, so that a region of the sample surface is discharged; and
a detector configured to detect interaction products of the primary particle beam and the sample.

13. The method of claim 12, further comprising a clock generator configured to control a sequence of $I_1$ and $I_2$.

14. The method of claim 12, wherein the gas supply arrangement is configured to control a sequence of $I_1$ and $I_2$.

15. The method of claim 12, wherein the scan generator is configured to control a sequence of $I_1$ and $I_2$.

16. The method of claim 12, wherein the particle-optical device comprises a scanning electron microscope.

17. The method of claim 12, wherein the particle-optical device comprises an ion beam microscope.

18. The method of claim 11, further comprising:
f) repeating a) to c), a) being repeated with a period $T_1$ and c) being repeated with a period $T_2$ which is different from $T_1$;
g) generating a second image of the sample on the basis of the interaction products detected when repeating c);
h) selecting a partial image from the second generated image so that image regions having image interferences are not contained in the partial image; and
i) combining the partial image of the first image and the partial image of the second image to form a composite image of the sample.

19. A method, comprising:
a) scanning a primary particle beam over a surface of a sample for a duration of a time $I_1$;
b) detecting interaction products of the primary particle beam and the sample;
c) introducing a gas pulse for a duration of time $I_2$, which overlaps with $I_1$, so that a region of the sample surface is discharged;
d) generating a first image of the sample on the basis of the detected interaction products; and
e) selecting a partial image from the first generated image so that image regions having image interference are not contained in the partial image,
wherein:
i) the method is performed using a particle-optical device, comprising:
a vacuum chamber configured to receive a sample;
a particle source configured to generate a primary particle beam;
a scan generator configured to guide the primary particle beam over a surface of the sample for the duration of time $I_1$;
a gas supply arrangement configured to introduce a gas into the vacuum chamber for the duration of time $I_2$, which overlaps with $I_1$, so that a region of the sample surface is discharged; and
a detector configured to detect interaction products of the primary particle beam and the sample; and
ii) at least one of the following holds:
the gas supply arrangement comprises a microvalve having a switching time of less than 100 microseconds;
the particle-optical device further comprises a clock generator configured to control a sequence of $I_1$ and $I_2$;
the gas supply arrangement is configured to control a sequence of $I_1$ and $I_2$; and
the scan generator is configured to control a sequence of $I_1$ and $I_2$.

20. The method of claim 19, wherein the gas supply arrangement comprises a microvalve having a switching time of less than 100 microseconds.

21. The method of claim 19, further comprising a clock generator configured to control a sequence of $I_1$ and $I_2$.

22. The method of claim 19, wherein the gas supply arrangement is configured to control a sequence of $I_1$ and $I_2$.

23. The method of claim 19, wherein the scan generator is configured to control a sequence of $I_1$ and $I_2$.

24. The method of claim 19, wherein the particle-optical device comprises a scanning electron microscope.

25. The method of claim 19, wherein the particle-optical device comprises an ion beam microscope.

26. The method of claim 19, further comprising:
f) repeating a) to c), a) being repeated with a period $T_1$ and c) being repeated with a period $T_2$ which is different from $T_1$;
g) generating a second image of the sample on the basis of the interaction products detected when repeating c);
h) selecting a partial image from the second generated image so that image regions having image interferences are not contained in the partial image; and
i) combining the partial image of the first image and the partial image of the second image to form a composite image of the sample.

* * * * *